United States Patent [19]

Miyata et al.

[11] Patent Number: 5,500,559
[45] Date of Patent: Mar. 19, 1996

[54] SEMICONDUCTOR DEVICE AND METHOD FOR MANUFACTURING THE SAME

[75] Inventors: Masahiro Miyata, Urayasu; Hirokazu Ezawa; Naoaki Ogure, both of Tokyo; Manabu Tsujimura, Yokohama; Takeyuki Ohdaira, Fujisawa; Hiroaki Inoue, Machida; Yukio Ikeda, Tokyo, all of Japan

[73] Assignees: Kabushiki Kaisha Toshiba, Kawasaki; Ebara Corporation, Tokyo, both of Japan

[21] Appl. No.: 249,127

[22] Filed: May 25, 1994

[30] Foreign Application Priority Data

May 28, 1993 [JP] Japan ..................................... 5-127117
Mar. 30, 1994 [JP] Japan ..................................... 6-060933

[51] Int. Cl.$^6$ ..................................................... H01L 31/06
[52] U.S. Cl. ........................... 257/762; 257/763; 257/764; 257/768
[58] Field of Search ..................................... 257/762, 763, 257/764, 768, 770, 773

[56] References Cited

U.S. PATENT DOCUMENTS

| | | | |
|---|---|---|---|
| 4,082,568 | 5/1977 | Lindmayer | 136/89 |
| 5,045,481 | 9/1991 | Schilling et al. | 437/2 |
| 5,240,497 | 8/1993 | Shacham et al. | 106/1.26 |

OTHER PUBLICATIONS

Patent Abstracts of Japan, vol. 5, No. 159 (E-77) Oct. 14, 1991 & JP-A-56 088 339 (Hitachi Ltd).
Patent Abstracts of Japan, vol. 15, No. 118 (E-1048) Mar. 22, 1991 & JP-A-03 008 337 (Fujitsu).
J. Electrochem. Soc., vol. 138, No. 12, Dec. 1991 pp. 3618-3624.

*Primary Examiner*—Donald L. Monin, Jr.
*Attorney, Agent, or Firm*—Finnegan, Henderson, Farabow, Garrett & Dunner

[57] ABSTRACT

In a semiconductor device and a method for manufacturing the same according to the present invention, for example, an insulating film is deposited on a silicon substrate, and a concave groove is formed in the insulating film in accordance with a predetermined wiring pattern. Titanium and palladium are deposited in sequence on the insulating film to form a titanium film and a palladium film, respectively. A silver film is formed on the palladium film by electroplating, and a groove-shaped silver wiring layer is formed by polishing. The resultant structure is annealed at a temperature of about 700° C., and an intermetallic compound is formed by alloying the titanium film and palladium film with each other. Consequently, a burying type wiring layer whose resistance is lower than that of aluminum, is constituted by the silver wiring layer and intermetallic compound.

5 Claims, 5 Drawing Sheets

RELATIVE
CONCENTRATION (%)
DIRECTLY AFTER
FORMATION OF FILMS
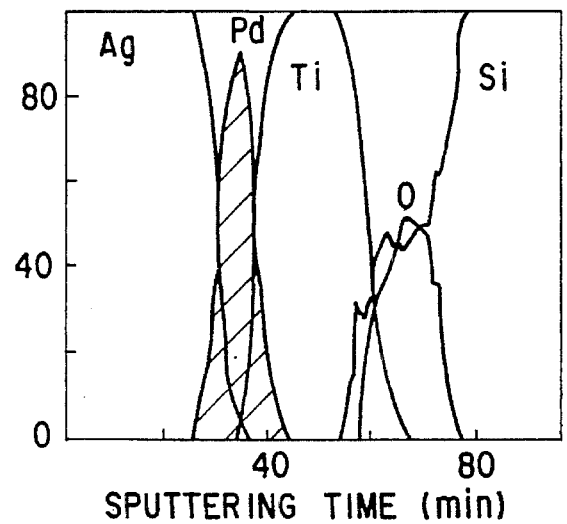
F I G. 5A
RELATIVE
CONCENTRATION (%)
400°C
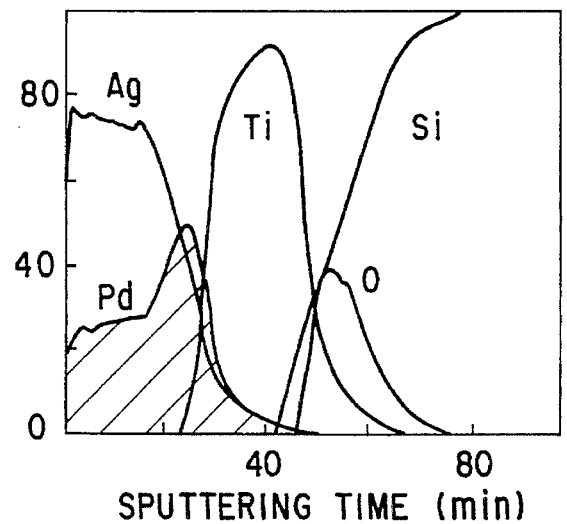
F I G. 5B
RELATIVE
CONCENTRATION (%)
600°C
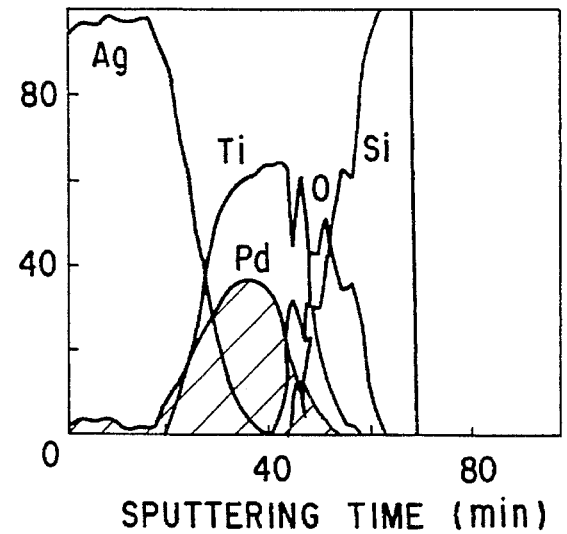
F I G. 5C

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same.

2. Description of the Related Art

FIGS. 1A to 1D show an example of a conventional process of manufacturing a wiring structure of a semiconductor device.

First an insulating film 2 is thermally oxidized and formed on a semiconductor substrate 1, and then an aluminum (Al) or an alloy 3 containing aluminum (Al) as the principal ingredient is formed on the insulating film 2 by sputtering (FIG. 1A).

The alloy 3 thus formed is patterned to have a predetermined shape through a well-known lithography process, thereby forming a first wiring layer 4 (FIG. 1B).

An interlayer insulating film 5 is deposited on the resultant structure, and then a via hole 6 is formed in the film 5 (FIG. 1C).

After that, a second wiring layer 7 formed of aluminum or an alloy containing aluminum as the principal ingredient, is formed on the interlayer insulating film 5, and connected to the first wiring layer 4 through the via hole 6 (FIG. 1D). Thus, a multilayer wiring layer of the first wiring layer 4 and second wiring layer 7 is formed.

However, the width of a wiring layer has recently become narrower in accordance with the progress of high degree of integration of semiconductor devices. For this reason, a conventional wiring layer containing aluminum nearly reaches its limitation in reliability of EM (electromigration) or the like.

Since high-speed operations of semiconductor devices cause a noticeable delay in signal transmission due to wiring resistance, it is desirable to decrease the wiring resistance further.

According to the conventional technique of assembling an LSI (Large Scale Integrated Circuit), a layer of Ag (silver) or Cu (copper) whose resistance is lower than that of aluminum can be formed. However, neither silver nor copper has been used for forming a wiring layer since they are difficult to etch.

SUMMARY OF THE INVENTION

It is accordingly an object of the present invention to provide a semiconductor device having a highly reliable wiring structure and a method for manufacturing the same.

According to one aspect of the present invention, there is provided a semiconductor device comprising:

a first metal layer formed on a substrate;

a second metal layer formed on the first metal layer, for forming an intermetallic compound together with the first metal layer; and a third metal layer formed on the second metal layer and having a property capable of forming a continuous solid solution together with the second metal layer, whereby the intermetallic compound of the first metal layer and the second metal layer, and the third metal layer constitute a wiring layer.

According to another aspect of the present invention, there is provided a semiconductor device comprising:

a substrate;

an insulating film formed on the substrate;

a wiring groove portion formed on the insulating film; and a wiring layer including at least a first metal layer formed in the wiring groove portion, a second metal layer formed on the first metal layer, and a third metal layer formed on the second metal layer, the first metal layer and the second metal layer constituting an intermetallic compound, and the third metal layer having a property capable of forming a continuous solid solution together with the second metal layer.

According to still another aspect of the present invention, there is provided a method for manufacturing a semiconductor device, comprising the steps of:

providing an insulating film on a substrate;

providing a wiring groove portion on the insulating film;

providing a first metal layer on the insulating film on which the wiring groove portion is formed;

providing a second metal layer on the first metal layer, for forming an intermetallic compound together with the first metal layer;

providing a third metal layer on the second metal layer, thereby forming a wiring layer from the third metal layer, the third metal layer having a property capable of forming a continuous solid solution together with the second metal layer;

annealing the first metal layer and the second metal layer to form the intermetallic compound; and constituting a burying type wiring layer by the intermetallic compound and the third metal layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 5A to 5C are views for explaining the results of analysis of the composition of the silver film in its depth direction using the Auger electron spectroscopy.

DETAILED DESCRIPTION OF THE PREFERRED EMBODIMENT

An embodiment of the present invention will now be described, with reference to the accompanying drawings. FIGS. 2A to 2D schematically show a process of forming a wiring structure of a semiconductor device.

Figure 1A:
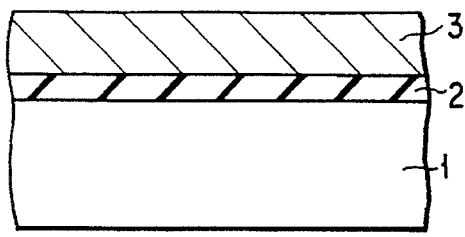
FIGS. 1A to 1D are cross-sectional views showing a conventional process of forming a wiring layer.
Figure 2A:
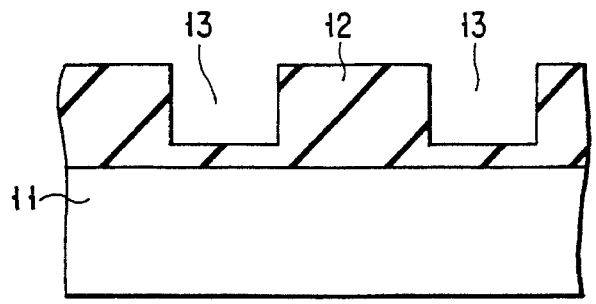
FIGS. 2A to 2D are cross-sectional views schematically showing a process of forming a wiring layer of a semiconductor device according to one embodiment of the present invention.
Figure 1B:
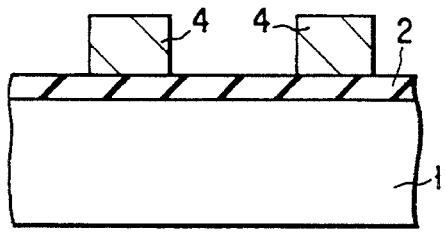

Primarily an insulating film ($SiO_2$) 12 is deposited on a silicon (Si) substrate 11 such as a semiconductor substrate and a circuit board. Concave grooves 13 are formed in the insulating film 12 by predetermined wiring patterning (FIG. 2A).

Figure 2B:
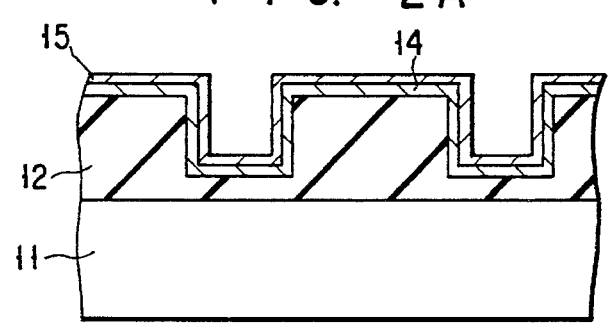

For example, titanium (Ti) and palladium (Pd) of noble metal are then deposited in sequence on the insulating film 12 by sputtering or CVD (chemical vapor deposition) to form a titanium film 14 of the first metal layer and a palladium film 15 of the second metal layer (FIG. 2B). In this case, the thickness of the titanium layer 14 is about 100 nm, and that of the palladium film 15 is about 50 nm.

Figure 2C:
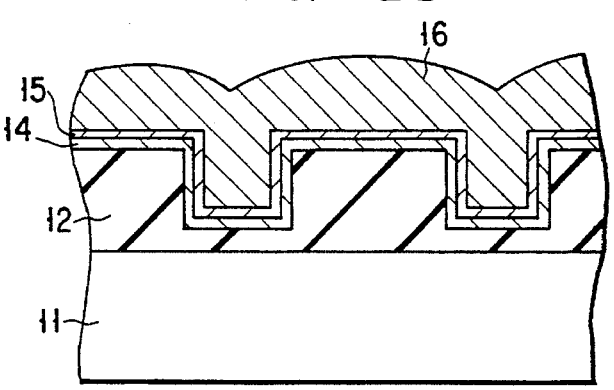
Figure 1D:
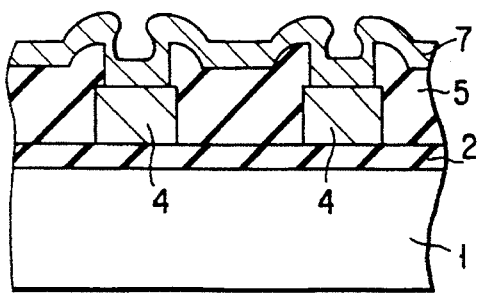

Thereafter, for example, the palladium film 15 serves as a cathode and is electroplated to form a silver (Ag) film 16 of the third metal layer thereon (FIG. 2C).

Figure 2D:
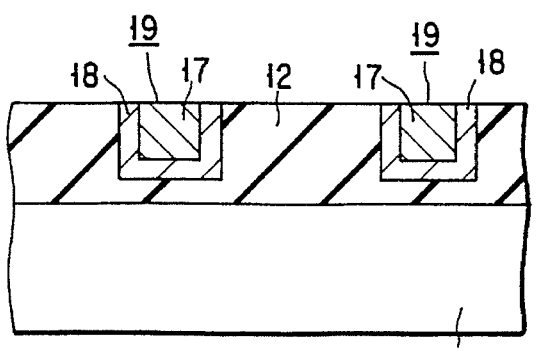

The silver film 16 other than those portions of the silver film which are formed in the grooves 13, is removed by polishing to form groove-shaped wiring layers 17. After that, the resultant structure is annealed at a temperature of about 700° C. in an atmosphere of inactive gas such as argon (Ar) and nitrogen ($N_2$), and the titanium film 14 and palladium film 15 are alloyed with each other, thus forming intermetallic compounds 18 (FIG. 2D). For example, the alloy of the films 14 and 15 can be attained by vacuum annealing as well as the annealing in the atmosphere of inactive gas.

Consequently, wiring layers 19 each having the alloy of titanium and palladium (intermetallic compound 18) and the groove-shaped wiring layer 17 of silver whose resistivity is lower than that of aluminum, are obtained.

The above-described multilayer wiring layer of the present invention is similar to the conventional one in that an interlayer insulating film is deposited, a via hole is formed, and a second (upper) wiring layer is formed.

Since, in the foregoing annealing treatment, palladium is diffused from the palladium film 15 into the silver film 16 to form a solid solution, the resistivity of the silver is likely to increase. The increased resistivity is however lowered by the intermetallic compound 18 formed by the titanium film 14 and palladium film 15 in accordance with the rise of the annealing temperature.

Figure 3:
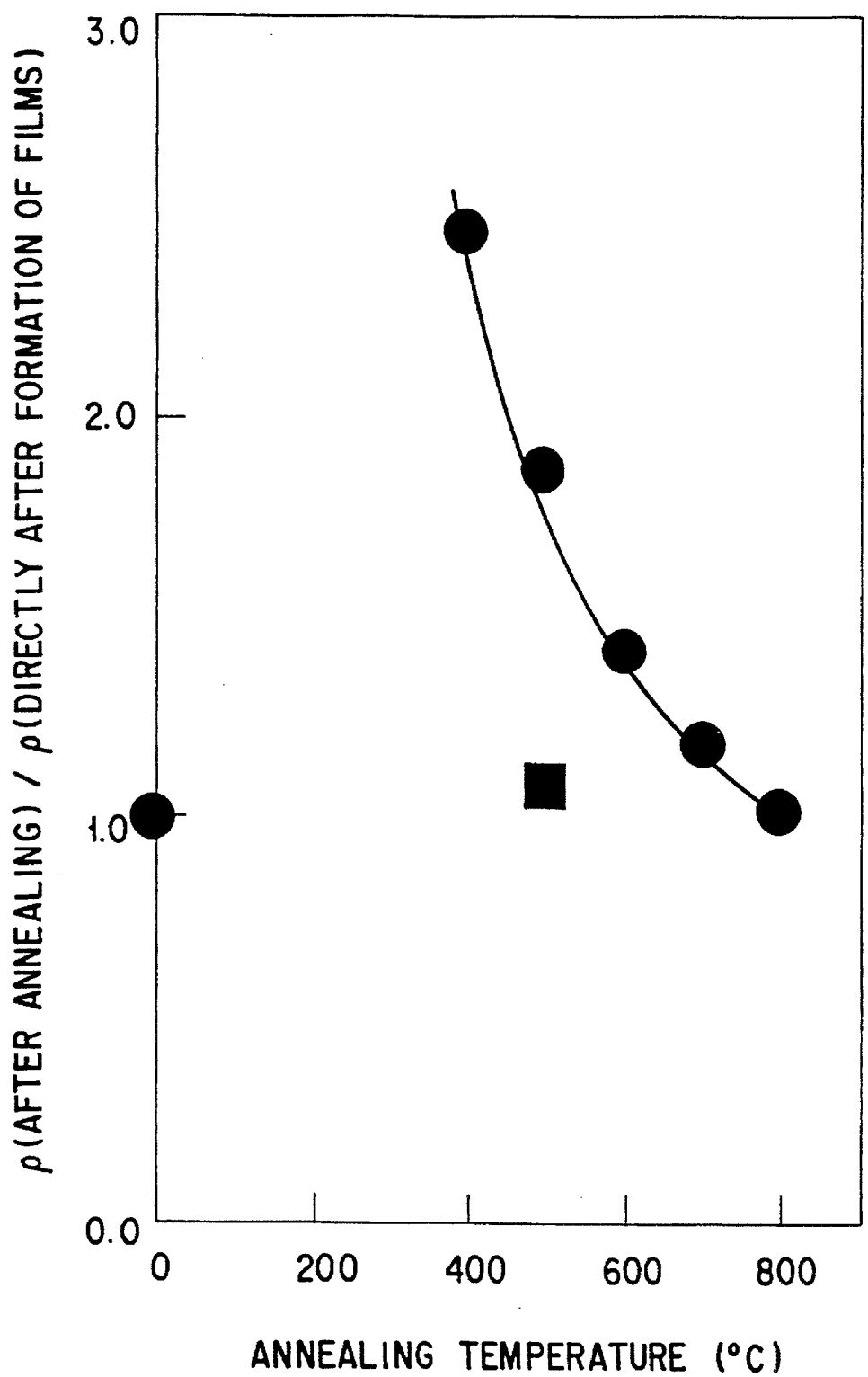
FIG. 3 is a view showing the dependence of the resistivity of a silver film on the annealing temperature.
Figure 4A:
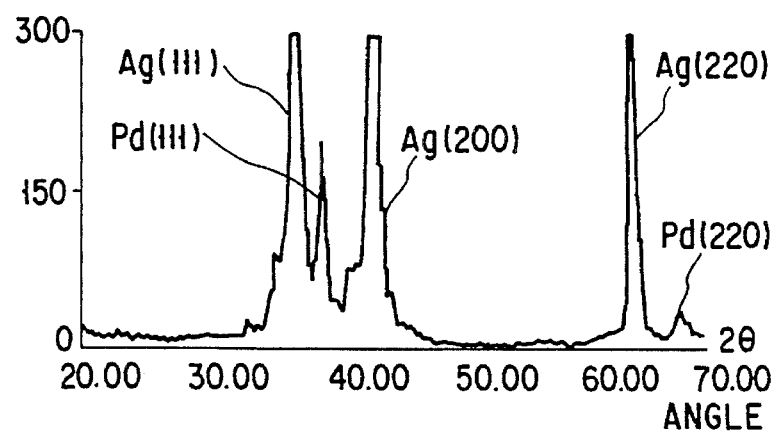
FIGS. 4A to 4D are views for explaining the results of measurement of X-ray diffraction for a thin film.
Figure 4B:
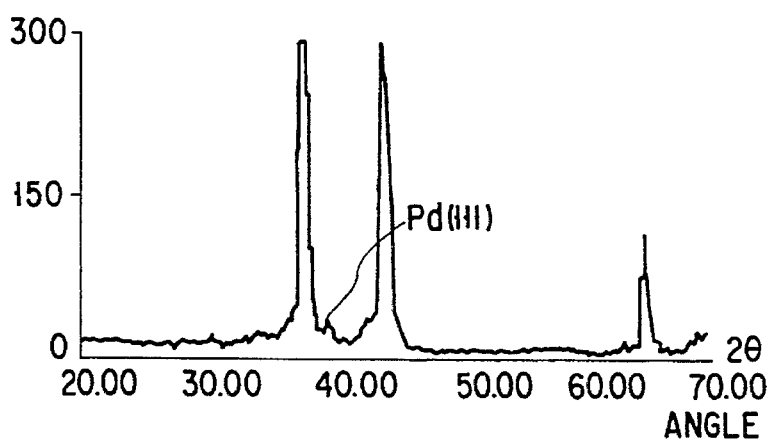
Figure 4C:
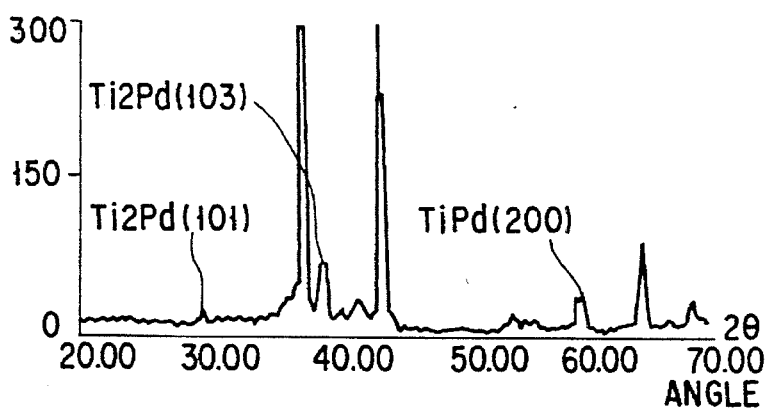
Figure 4D:
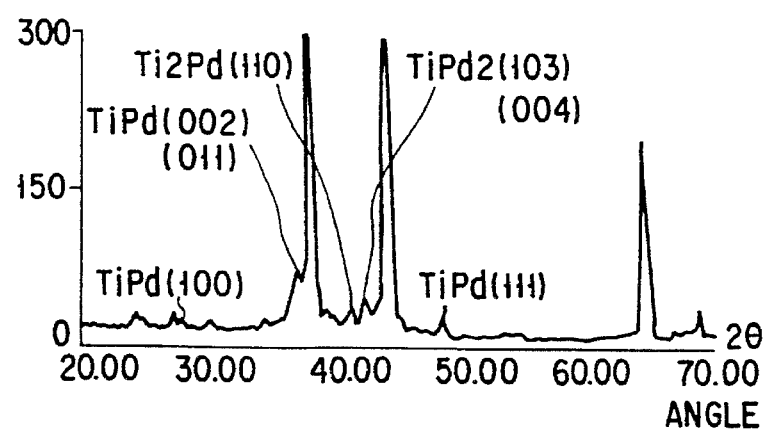

FIG. 3 shows the dependence of the resistivity of the silver on the annealing temperature. In this figure, the insulating film 12 of 100 nm, titanium film 14 of 100 nm, palladium film 15 of 50 nm, and silver film 16 of 600 nm, all of which are formed on the silicon substrate 11, are taken as samples, and the relationship between the annealing temperature (abscissa) and the ratio (ordinate) of the resistivity of each sample after the annealing treatment to that of each sample immediately after the films are formed, is shown.

As is seen from FIG. 3, the resistivity of the silver increases and then decreases gradually in accordance with the rise of the annealing temperature. After the annealing temperature reaches 800° C., it is maintained at the same value as set before the annealing treatment (as indicated by round black spots). As is also seen from FIG. 3, the resistivity does not change so widely when the samples annealed at a temperature of 700° C. are annealed again at a temperature of 500° C. (indicated by a square black spot).

Variations in structure and composition of the foregoing wiring layer of titanium, and palladium and silver with the rise of the annealing temperature, will now be described, with reference to FIGS. 4A to 4D and FIGS. 5A to 5C.

FIGS. 4A to 4D show the results obtained from the measurement of X-ray diffraction for a thin film. In these figures, the insulating film 12 of 100 nm, titanium film 14 of 100 nm, palladium film 15 of 50 nm, and silver film 16 of 500 nm, all of which are formed on the silicon substrate 11, are taken as samples and, under the measurement conditions that the wavelength (CuKa)λ of an X ray is 0.15405 nm and its incident angle θ is 5°, the abscissa indicates the angle and the ordinate does the reflection intensity of the X ray. FIGS. 4A to 4D show the measurement results obtained directly after the above films have been formed and when the annealing temperatures are 400° C., 600° C., and 800° C., respectively.

FIGS. 5A to 5C show the results obtained from the analysis of composition of the silver film 16 in the depth direction using the Auger electron spectroscopy. In these figures, the same samples as shown in FIGS. 4A to 4D are used, and the abscissa indicates the sputtering time (min) and the ordinate the relative concentration (%). FIGS. 5A to 5C show the analysis results obtained directly after the above films have been formed and when the annealing temperatures are 400° C. and 600° C., respectively.

It has been turned out from FIGS. 4A to 4D and 5A to 5C that the intermetallic compound 18 of titanium and palladium is formed and the palladium dissolved in the silver is decreased when the annealing temperature exceeds 600° C. In other words, the increased resistivity of the silver is decreased by removing the palladium from the silver film 16 when the intermetallic compound 18 is formed.

According to the present invention, as described above, the wiring structure can be obtained in a simple fashion. More specifically, the wiring layer of silver can be formed by electroplating which is a simple wiring-layer forming method. This method allows the use of silver whose resistivity is lower than that of aluminum, though the silver has not been used because it is difficult to etch. Therefore, the resistance of the wiring layer can be lowered, and the wiring layer can easily be applied to high-speed semiconductor devices and is able to improve in reliability in high degree of integration.

Figure 1C:
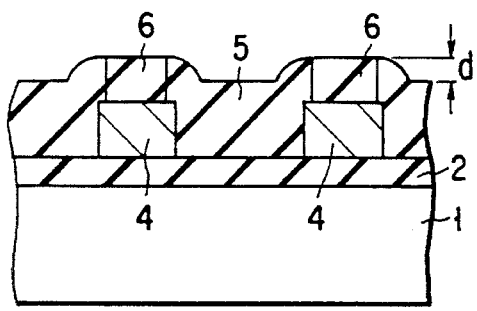

In the conventional method for manufacturing a semiconductor device, a high-temperature treatment could not be employed, in view of the melting point of aluminum. If, however, the silver of the present invention is used, the restriction on the temperature can be removed; accordingly, the freedom to select various treatments can be increased. Furthermore, since the surface of the multilayer wiring structure of the present invention is flattened by polishing and a burying type wiring layer is formed thereon, the step d of the conventional structure, shown in FIG. 1C, will not occur. Inevitably, there occurs no defects such as disconnection of wiring due to the step d.

In the above embodiment, the thickness of the titanium film is about 100 nm and that of the palladium film is about 50 nm. However, the former can be set to 40 nm and the latter can be set to 20 nm.

Figure 6:
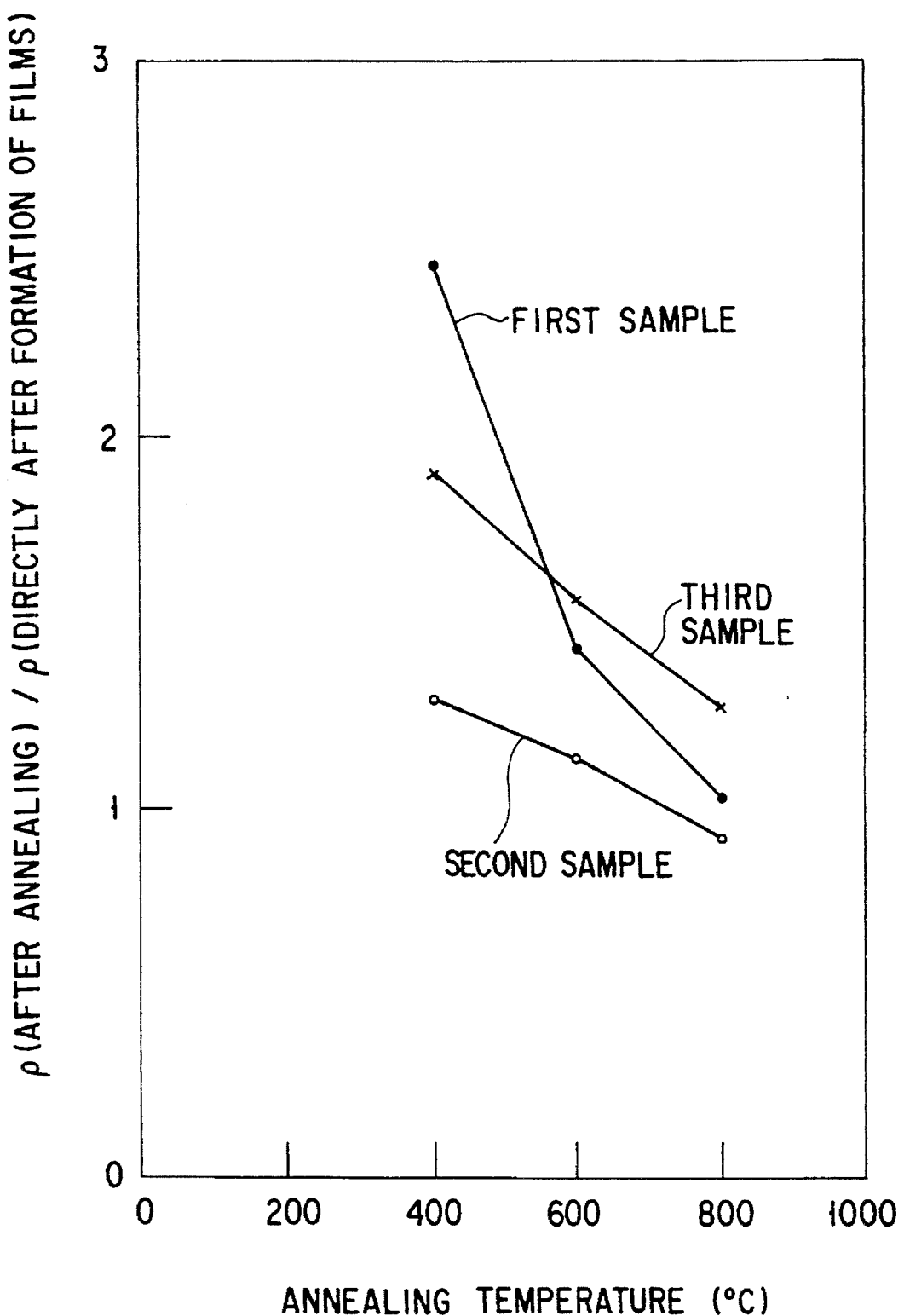
FIG. 6 is a view showing the dependence of the resistivity of the silver film on the annealing temperature, with respect to titanium and palladium films each having different thicknesses.

FIG. 6 shows the dependence of the resistivity of silver upon the treating temperature with respect to the titanium and palladium films having different thicknesses. For example, a layer having titanium film 14 of 100 nm and palladium film 15 of 50 nm is used as a first sample, a layer having titanium film 14 of 40 nm and palladium film 15 of 20 nm is used as a second sample, and a layer having titanium film 14 of 20 nm and palladium film 15 of 50 nm is used as a third sample. In each of these samples, the thickness of the insulating film 12 formed on the silicon substrate 11 is 100 nm and that of the silver film 16 is 500 nm. In FIG. 6, the abscissa represents the annealing temperature, and the ordinate the ratio of the resistivity after the annealing treatment to the resistivity immediately after the formation of the films.

It is understood from FIG. 6 that the resistivity of the silver is minimized at every annealing temperature when the second sample is used. Consequently, it is desirable that the titanium film should be thicker than the palladium film. Even though the thicknesses of the titanium and palladium films are the same, some advantages can be anticipated.

In any case, it is desirable that the thickness of the palladium film should be 100 nm or less (≈0) and therefore the palladium film has only to be considerably thinner than the titanium film or the silver film.

In the above embodiment, the annealing temperature is set to 700° C. (when the thickness of the titanium film is about 100 nm and that of the palladium film is about 50 nm). However, the temperature most suitable for alloying can be set in accordance with each individual thickness.

Furthermore, the silver film is formed by plating as the third metal layer. However, the silver film can be formed by sputtering. Gold (Au), copper (Cu), or the like can be substituted for the silver. In either case, the first metal layer for forming the intermetallic compound cannot be limited to titanium, or the second metal layer therefor cannot be limited to palladium.

Each of the first, second and third metal layers can be formed of an alloy as well as a single metal.

In order to lower the resistance of the wiring layer further and improve the reliability thereof further, another layer can be formed in addition to the first, second, and third metal layers.

The present invention is not applied simply to form a burying type wiring layer.

It is needless to say that various changes and modifications can be made without departing from the scope of the subject matter of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a substrate;

an insulating film on the substrate, the insulating film having a wiring groove portion; and a wiring layer embedded in the wiring groove portion, and including an intermetallic compound layer comprising a first metal and a second metal and a metal layer comprising a third metal on the intermetallic compound layer, wherein said third metal layer comprises silver layer, wherein the third metal is capable of forming a continuous solid solution with the second metal.

2. The semiconductor device according to claim 1, wherein an amount of the first metal of the intermetallic compound layer is equal to or larger than an amount of the second metal thereof.

3. A semiconductor device comprising:

a substrate;

an insulating film formed on the substrate, the insulating film having a wiring groove portion; and a wiring layer embedded in the wiring groove portion, and including an intermetallic compound layer comprising of titanium and palladium and a metal layer comprising silver on the intermetallic compound layer, wherein the silver is capable of forming a continuous solid solution with the palladium.

4. The semiconductor device according to claim 3, wherein an amount of the titanium of the intermetallic compound layer is equal to or larger than an amount of the palladium thereof.

5. A semiconductor device comprising:

a substrate;

an insulating film formed on said substrate; and a wiring layer having a structure of Ag–(Ti×Pd), which is at least embedded in a wiring groove portion formed in said insulating film, and includes a (Ti×Pd) layer of an intermetallic compound formed by Ti and Pd layers and an Ag layer formed on the (Ti×Pd) layer and capable of forming a continuous solid solution with the Pd layer.

* * * * *